US010475750B2

(12) United States Patent
Nair et al.

(10) Patent No.: US 10,475,750 B2
(45) Date of Patent: Nov. 12, 2019

(54) SYSTEMS, METHODS, AND APPARATUSES FOR IMPLEMENTING AN ORGANIC STIFFENER WITH AN EMI SHIELD FOR RF INTEGRATION

(71) Applicant: Intel Corporation, Santa Clara, CA (US)

(72) Inventors: Vijay K. Nair, Mesa, AZ (US); Pramod Malatkar, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/075,513

(22) PCT Filed: Apr. 2, 2016

(86) PCT No.: PCT/US2016/025789
§ 371 (c)(1),
(2) Date: Aug. 3, 2018

(87) PCT Pub. No.: WO2017/171893
PCT Pub. Date: Oct. 5, 2017

(65) Prior Publication Data
US 2019/0051615 A1    Feb. 14, 2019

(51) Int. Cl.
*H01L 23/552* (2006.01)
*H01L 23/48* (2006.01)
(Continued)

(52) U.S. Cl.
CPC ........ *H01L 23/552* (2013.01); *H01L 21/4857* (2013.01); *H01L 23/3675* (2013.01);
(Continued)

(58) Field of Classification Search
CPC ... H01L 23/552; H01L 21/4857; H01L 24/49; H01L 24/31; H01L 24/81; H01L 24/75;
(Continued)

(56) References Cited

U.S. PATENT DOCUMENTS 5,703,753 A * 12/1997 Mok .................... H01L 23/4006
174/16.3
6,515,861 B1 * 2/2003 Andric ................. H01L 23/4093
174/16.3
(Continued)

FOREIGN PATENT DOCUMENTS

KR    10-2014-0039547    4/2014

OTHER PUBLICATIONS

International Preliminary Report on Patentability for International Patent Application No. PCT/US2016/025789, dated Oct. 11, 2018, 11 pages.
(Continued)

*Primary Examiner* — Earl N Taylor
(74) *Attorney, Agent, or Firm* — Schwabe, Williamson & Wyatt, P.C.

(57) ABSTRACT

In accordance with disclosed embodiments, there are provided methods, systems, and apparatuses for implementing an organic stiffener with an EMI shield for RF integration. For instance, in accordance with one embodiment, there is an apparatus having therein: a substrate layer having electrical traces and a ground plane therein; a functional semiconductor die electrically interfaced to the electrical traces of the substrate layer; a heat pipe thermally interfaced to a top surface of the functional semiconductor die; one or more interposers of an organic dielectric material electrically connected to the ground plane of the substrate layer and electrically connected to the heat pipe; in which the one or more interposers form the electromagnetic shield to electrically shield the functional semiconductor die; and further in which the one or more interposers form the organic stiffener are to mechanically retain the substrate layer in a planer form. Other related embodiments are disclosed.

28 Claims, 10 Drawing Sheets

(51) Int. Cl.
  *H01L 23/00* (2006.01)
  *H01L 23/367* (2006.01)
  *H01L 21/48* (2006.01)
  *H01L 23/498* (2006.01)
  *H01L 23/66* (2006.01)
  *H01L 25/18* (2006.01)

(52) U.S. Cl.
  CPC ........ *H01L 23/48* (2013.01); *H01L 23/49822* (2013.01); *H01L 23/562* (2013.01); *H01L 24/31* (2013.01); *H01L 24/49* (2013.01); *H01L 24/75* (2013.01); *H01L 24/81* (2013.01); *H01L 23/49816* (2013.01); *H01L 23/49833* (2013.01); *H01L 23/66* (2013.01); *H01L 25/18* (2013.01); *H01L 2224/32245* (2013.01); *H01L 2924/10253* (2013.01); *H01L 2924/1432* (2013.01); *H01L 2924/15153* (2013.01); *H01L 2924/15311* (2013.01); *H01L 2924/15331* (2013.01); *H01L 2924/3025* (2013.01); *H01L 2924/3511* (2013.01); *H01L 2924/3512* (2013.01)

(58) Field of Classification Search
  CPC ........... H01L 23/49822; H01L 23/3675; H01L 23/562; H01L 23/48
  See application file for complete search history.

(56) References Cited

U.S. PATENT DOCUMENTS

| | | | | |
|---|---|---|---|---|
| 7,220,624 B2* | 5/2007 | Neogi | ..................... | H01L 21/50 257/E21.499 |
| 7,687,899 B1* | 3/2010 | Berry | ..................... | H01L 21/561 257/687 |
| 7,755,181 B2* | 7/2010 | Han | ..................... | H01L 25/105 257/685 |
| 7,872,343 B1* | 1/2011 | Berry | ..................... | H01L 21/561 257/687 |
| 8,283,767 B1* | 10/2012 | Berry | ..................... | H01L 21/561 257/686 |
| 8,349,658 B2* | 1/2013 | Chi | ..................... | H01L 21/4832 257/666 |
| 8,946,072 B2* | 2/2015 | Wu | ..................... | H01L 24/81 438/613 |
| 9,029,989 B2 | 5/2015 | Park | | |
| 9,831,207 B2* | 11/2017 | Wu | ..................... | H01L 21/563 |
| 2003/0025180 A1* | 2/2003 | Alcoe | ..................... | H01L 23/552 257/659 |
| 2004/0075987 A1* | 4/2004 | Shim | ..................... | H01L 21/4878 361/704 |
| 2004/0195701 A1* | 10/2004 | Attarwala | ..................... | H01L 21/4846 257/783 |
| 2006/0084254 A1* | 4/2006 | Attarwala | ..................... | H01L 21/4857 438/584 |
| 2006/0091509 A1* | 5/2006 | Zhao | ..................... | H01L 23/04 257/678 |
| 2006/0091542 A1* | 5/2006 | Zhao | ..................... | H01L 21/565 257/738 |
| 2007/0145548 A1* | 6/2007 | Park | ..................... | H01L 21/6835 257/678 |
| 2008/0157326 A1* | 7/2008 | Han | ..................... | H01L 25/105 257/686 |
| 2010/0108371 A1* | 5/2010 | Furutani | ..................... | H01L 21/56 174/260 |
| 2010/0117218 A1* | 5/2010 | Park | ..................... | H01L 21/563 257/693 |
| 2011/0049704 A1* | 3/2011 | Sun | ..................... | H01L 21/50 257/737 |
| 2011/0291249 A1* | 12/2011 | Chi | ..................... | H01L 21/4832 257/675 |
| 2012/0248569 A1* | 10/2012 | Jenkins | ..................... | H01L 23/49822 257/531 |
| 2013/0016477 A1* | 1/2013 | Yokoya | ..................... | H01L 23/36 361/719 |
| 2013/0078915 A1* | 3/2013 | Zhao | ..................... | H01L 23/552 455/41.1 |
| 2013/0200513 A1* | 8/2013 | Wu | ..................... | H01L 24/81 257/737 |
| 2014/0048326 A1* | 2/2014 | Lin | ..................... | H05K 9/00 174/377 |
| 2014/0048944 A1* | 2/2014 | Lin | ..................... | H01L 23/562 257/773 |
| 2014/0048949 A1* | 2/2014 | Lin | ..................... | H01L 21/50 257/774 |
| 2014/0048950 A1* | 2/2014 | Lin | ..................... | H01L 23/3121 257/774 |
| 2014/0048951 A1* | 2/2014 | Lin | ..................... | H01L 23/481 257/774 |
| 2014/0183752 A1* | 7/2014 | Lin | ..................... | H01L 24/19 257/774 |
| 2014/0266850 A1* | 9/2014 | Suorsa | ..................... | H05K 9/0088 342/1 |
| 2017/0062394 A1* | 3/2017 | Lin | ..................... | H01L 23/5385 |
| 2017/0287799 A1* | 10/2017 | Klein | ..................... | H01L 23/16 |
| 2017/0287873 A1* | 10/2017 | Sankarasubramanian | ..................... | H01L 24/32 |
| 2018/0323159 A1* | 11/2018 | Kamgaing | ..................... | H01L 23/66 |
| 2019/0051615 A1* | 2/2019 | Nair | ..................... | H01L 24/49 |

OTHER PUBLICATIONS

International Search Report and Written Opinion for International Patent Application No. PCT/US2016/025789 dated Dec. 8, 2016, 14 pgs.

* cited by examiner

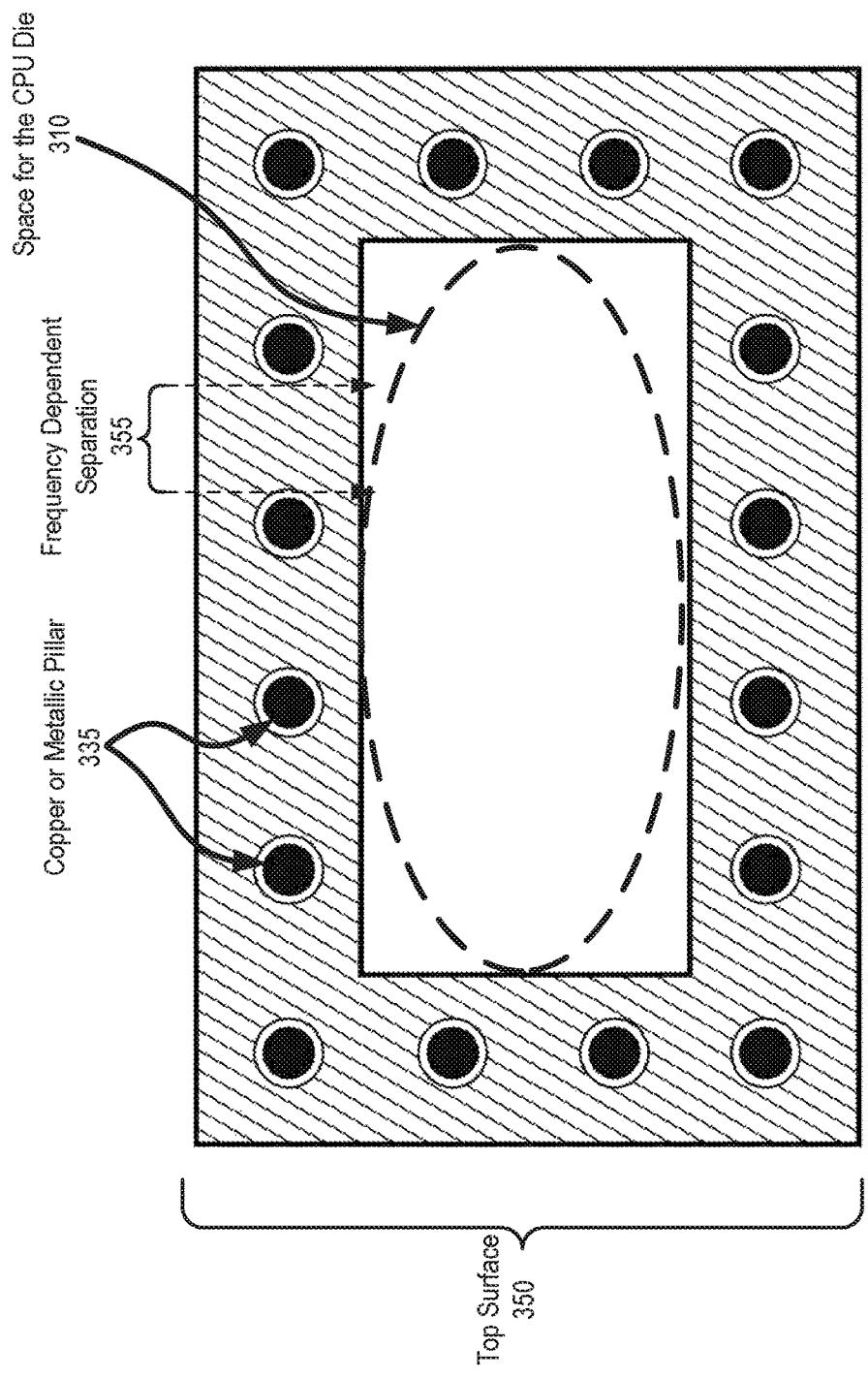

301 Top View (of "L" Shaped Organic Stiffener or Interposer)

SYSTEMS, METHODS, AND APPARATUSES FOR IMPLEMENTING AN ORGANIC STIFFENER WITH AN EMI SHIELD FOR RF INTEGRATION

CROSS-REFERENCE TO RELATED APPLICATION

This patent application is a U.S. National Phase Application under 35 U.S.C. § 371 of International Application No. PCT/US2016/025789, filed Apr. 2, 2016, entitled "SYSTEMS, METHODS, AND APPARATUSES FOR IMPLEMENTING AN ORGANIC STIFFENER WITH AN EMI SHIELD FOR RF INTEGRATION," which designates the United States of America, the entire disclosure of which is hereby incorporated by reference in its entirety and for all purposes.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The subject matter described herein relates generally to the field of semiconductor and electronics manufacturing, and more particularly, to systems, methods, and apparatuses for implementing an organic stiffener with an EMI shield for RF integration.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed subject matter.

Today's consumer electronics market frequently demands complex functions requiring very intricate circuitry. Scaling to smaller and smaller fundamental building blocks, (e.g. transistors), has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support increased circuit density.

Key challenges with the manufacture of integrated circuit (IC) semiconductor packaging are the problems of substrate cracking and substrate warpage as the substrates are manufactured thinner and thinner and also the problem of electromagnetic interference (EMI) within such packages as semiconductor packages become increasingly dense with functional circuitry.

As the form factor requirements of electronics become thinner, so do the silicon dies and also the substrate materials upon which various electronic components are mounted and the stresses that such materials undergo becomes more problematic because the silicon dies and the substrate materials become increasingly fragile as they become thinner. These stresses manifest in the form of substrate warping and risk of cracking of the silicon dies, each of which render the package inoperable.

Issues surrounding substrate cracking are especially problematic with the reliability of ultra thin (e.g., sub 1.5 mm thin) substrate packages which are in high demand today.

Thin substrates are more prone to warpage which presents problems with manufacturability and also product resilience. Even within client laptop and desktop type systems package warpage can be a problem. The presence of high package warpage at surface mount reflow processes during manufacturing results in non-contact opens, solder ball bridging, and other problems resulting in product failure.

With regard to problem of electromagnetic interference, the integration of a Radio Frequency (RF) die or other wireless transceiver die or wireless transceiver components within semiconductor packages with other functional semiconductor die such as high power logic circuits and CPUs is especially problematic due to the interference of the RF dies with the other functional semiconductor dies within the same semiconductor package as the competing electromagnetic signals and interference from each can be highly disruptive to the other.

Prior solutions resorted to simply keeping the RF dies and other functional semiconductor dies such as a CPU or high powered logic die separated by a large distance. Doing so generally meant that RF dies and CPU dies were relegated to separate packages to minimize the disruptive interference emanating from each but it is not always practical or desirable to separate such components.

The present state of the art may therefore benefit from the organic stiffener with an EMI shield for RF integration as is described herein.

BRIEF DESCRIPTION OF THE DRAWINGS

Embodiments are illustrated by way of example, and not by way of limitation, and will be more fully understood with reference to the following detailed description when considered in connection with the figures in which:

FIG. 3A depicts a top view of an organic stiffener having integrated therein an electromagnetic shield in accordance with described embodiments;

DETAILED DESCRIPTION

Figure 1:
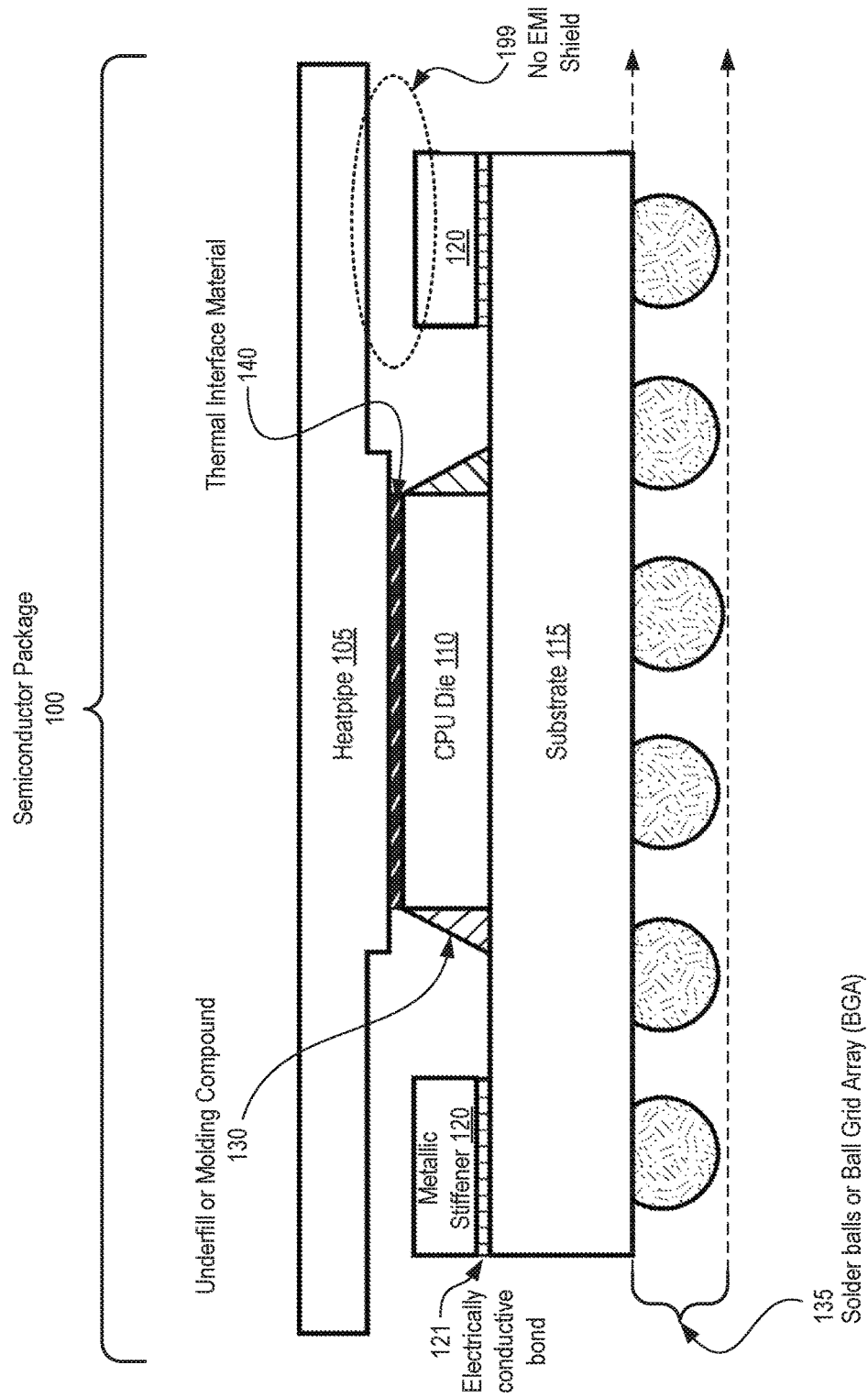
FIG. 1 depicts a schematic of a semiconductor package in accordance with described embodiments.

Described herein are systems, apparatuses, and methods for implementing an organic stiffener with an EMI shield for RF integration in accordance with described embodiments. For instance, in accordance with one embodiment, there is an apparatus having therein: a substrate layer having electrical traces and a ground plane therein; a functional semiconductor die electrically interfaced to the electrical traces of the substrate layer; a heat pipe thermally interfaced to a top surface of the functional semiconductor die; one or more interposers of an organic dielectric material electrically connected to the ground plane of the substrate layer and electrically connected to the heat pipe; in which the one or more interposers form the electromagnetic shield to electrically shield the functional semiconductor die; and further in which the one or more interposers form the organic stiffener are to mechanically retain the substrate layer in a planer form.

In accordance with described embodiments, the three-fold problem of substrate cracking, substrate warpage, and Electromagnetic interference (EMI) amongst semiconductor dies such as a CPU and RF die, is addressed through the use of an organic stiffener with an EMI shield for RF integration in which the stiffener provides support and structure to the substrate to mitigate cracking and warpage and in which the EMI shield mitigates the EMI interference amongst semiconductor dies, thus permitting the integration of a high powered semiconductor die such as a CPU or logic die within the same package as an RF die or other wireless transceiver die. Additional solutions are further described for the mitigation of risk of cracking the silicon die during or after installation of a heatsink or other thermal solution and also smaller form factors through the use of inductors embodied within the described organic stiffener/interposer layer.

Metallic stiffeners are costly on a per-unit basis which contributes directly to the per-unit cost of the package being manufactured, and thus, the described organic stiffener as described herein may be fabricated out off a less costly material such as a more common substrate or printed circuit board (PCB) or mold compound material. Moreover, the material of the organic stiffener may be selected to exhibit desirable material properties including a relatively higher CTE (coefficient of thermal expansion) in comparison to a more costly metallic stiffener and provide the requisite function of stiffness, resisting warpage, withstanding high-temperature reflow processes, and so forth.

Still further, the softness of the solder material interfacing the surface of the interposers or copper pillars within the organic stiffener to the heat sink provides a standoff and thus provides a cushioning and stress absorption function to mitigate cracking risk to the silicon die, including both transient and steady-state loads which are especially observed at die corners.

Through the use of top and bottom solder an effective EMI shield is achieved in which top solder (on the top surface of the stiffener) makes contact with or bonds to the metallic thermal solution such as a heatpipe and in which bottom solder or electrically conductive adhesive (on the bottom surface of the stiffener) electrically interfaces the copper pillars of the organic stiffener into the ground plane of the substrate and motherboard. With the effective EMI shield, it is therefore possible to place an RF die in very close physical proximity with the high powered CPU die without problematic EMI coupling between them, including in near proximity on the motherboard or even within the same semiconductor package.

The organic stiffener described herein further may embody passive inductors such as X/Y or Z-plane inductors, area capacitors, etc., so as to both provide needed power delivery while simultaneously reducing the form factor for the board of a computing device.

In the following description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

In addition to various hardware components depicted in the figures and described herein, embodiments further include various operations which are described below. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Any of the disclosed embodiments may be used alone or together with one another in any combination. Although various embodiments may have been partially motivated by deficiencies with conventional techniques and approaches, some of which are described or alluded to within the specification, the embodiments need not necessarily address or solve any of these deficiencies, but rather, may address only some of the deficiencies, address none of the deficiencies, or be directed toward different deficiencies and problems which are not directly discussed.

FIG. 1 depicts a schematic of a semiconductor package 100 in accordance with described embodiments. In particular, there is depicted at the base a series of solder balls or a ball grid array (BGA) 135. The solder balls are electrically interfaced with the substrate 115 which in turn is electrically interfaced to a CPU die 110. Protecting and encompassing the CPU die 110 is underfill or molding compound 130. On each side there is a metallic stiffener 120 depicted. A thermal interface material 140 thermally interfaces the CPU die 110 with the heatpipe 105 depicted. The heatpipe may be installed by the manufacturer of the semiconductor package or may be provided and installed by a third party, by the consumer, or by an entity other than the manufacturer of the semiconductor package 100.

Notably, within the semiconductor package 100 depicted, there is no EMI shield 199 and thus, electromagnetic interference can both egress from the high power CPU die 110 and also ingress into the CPU die 110 potentially interfering with its operation.

In this particular embodiment, the metallic stiffener post 120 addresses the problems of substrate cracking and warpage by providing reinforcement and structure but the metallic stiffener post is not suitable for EMI shielding as it does not fully enclose the CPU die 110 within a metal cage.

The shape of the package changes with temperature, causing the substrate to potentially curl, warp, or bend and generally adopt a non-planer shape. During manufacturing this is problematic due to the simple fact that assembly of the semiconductor package requires it to be planer or flat to, for instance, attach the heatpipe 105 or other thermal solution to the CPU die 110 without cracking and install the substrate package onto a motherboard.

If the substrate or the package is warped, then additional force is concentrated upon the CPU die when the heatpipe is installed, which may crack the CPU die 110 due to the localized stress.

Similarly, if the package is warped, then installing the package onto a motherboard is problematic because a surface process such as electrically interfacing the package to the motherboard through the solder balls or ball grid array will fail due to leaving electrical opens between the package and the motherboard where the package curls or warps away from the flat surface of the motherboard.

For instance, where the package curls away from the board to which it is being attached, typically in the corners, there an excessive amount of height between the package substrate and the motherboard, thus leaving an open because the solder balls do not physically contact both the substrate of the package and the contact point on the motherboard.

Moreover, pressing a warped package onto a flat motherboard requires additional force which could damage the motherboard or the package, or transfer excessive force into the solder balls at the lower portion of the warping which will then squish some of the solder balls to the point where they create an unintended electrical join called breaching between the solder balls (e.g., an electrical short).

Although the stiffener is beneficial in terms of preventing warping and cracking by keeping the substrate and package in a planar shape through a range of operating temperatures, the metallic stiffener interferes with ODIF (Output Distributional Influence Function) signals as it both fails to provide adequate EMI shielding and additionally because it creates electromagnetic interference without additional engineering solutions to electrically interface the metallic stiffer to the ground plane of the motherboard.

Therefore, in accordance with one embodiment, the organic stiffener 220 provides an electrically conductive base between the metallic stiffener 120 and the substrate 115 through the electrically conductive base 121 as depicted. The electrically conductive base 121 electrically connects the metallic stiffener 120 to ground pins on the substrate 115 and ultimately then into the mother board. In such a way, the metallic stiffener 120 may be employed as both a structural component and also aids in the mitigation of electromagnetic interference.

However, the additional steps necessary may introduce additional cost and delay and complexity into the manufacturing process, and therefore, alternative embodiments utilize a lower-cost and simplified solution through the use of an organic stiffener which integrates EMI shielding as described in further detail below.

Figure 2:
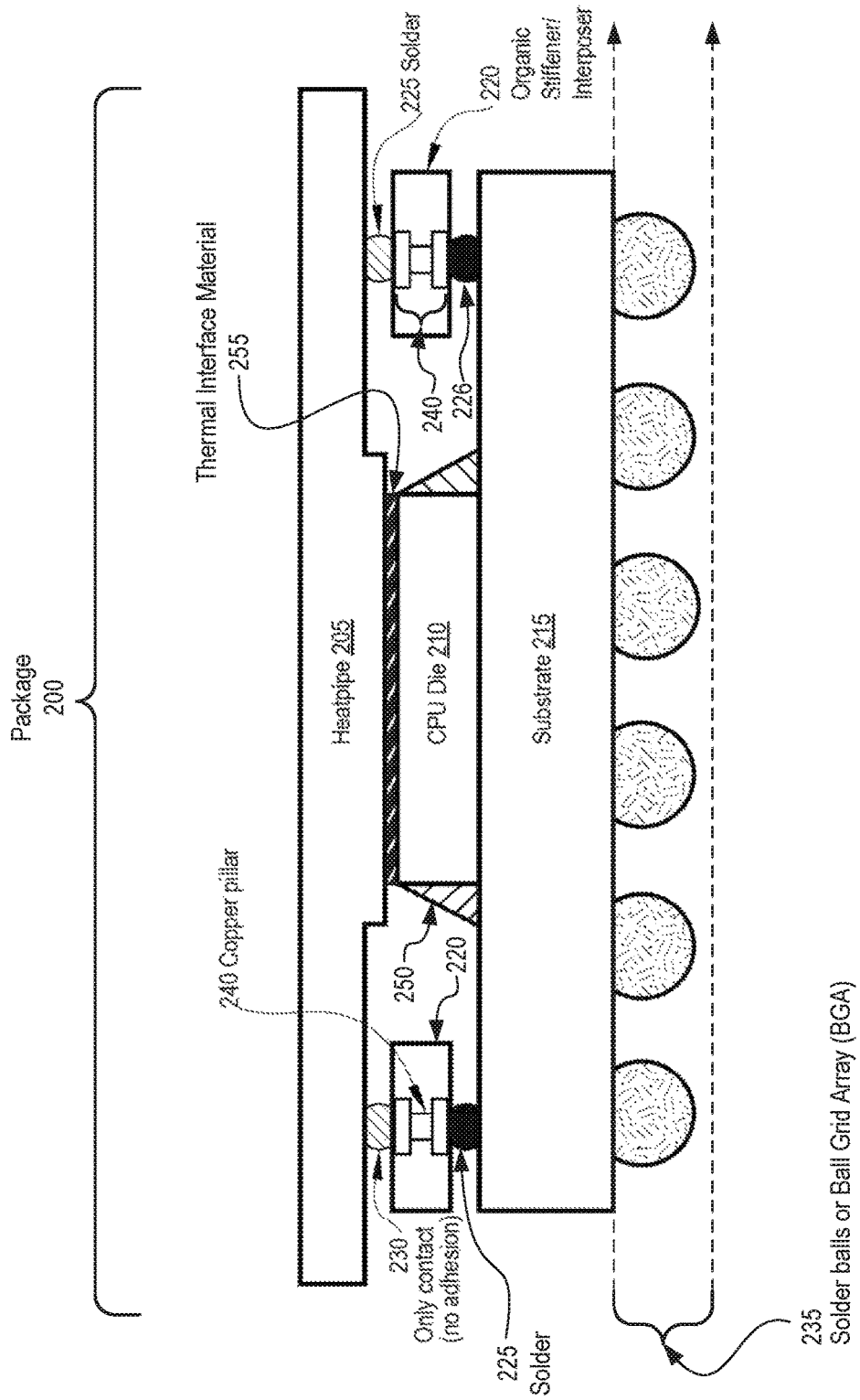
FIG. 2 depicts a schematic of a semiconductor package having integrated therein an organic stiffener with an EMI shield in accordance with described embodiments.

FIG. 2 depicts a schematic of a semiconductor package 200 having integrated therein an organic stiffener 220 with an EMI shield in accordance with described embodiments. In particular, there is depicted at the base a series of solder balls or a ball grid array (BGA) 235 in contact with the substrate 215. The CPU die 210 is electrically interfaced to the substrate and is protected by underfill or molding compound 250. A thermal interface material 255 thermally interfaces the CPU die 210 with the heatpipe 205 as depicted.

An organic stiffener and interposer 220 is further depicted on either side of the CPU die 210, within which there is a copper pillar 240 thus forming a metallic cage surrounding the CPU die 210 and in so doing, providing an EMI shield around the CPU die 210. The copper pillar 240 may be fabricated via Plated Through Hole (PTH) techniques or a Through-silicon via technique, or other relevant methods by which to integrate the copper pillar 240 into the organic stiffener 220.

The CPU die 210 is made of silicon and therefore exhibits a very low coefficient of thermal expansion (CTE) in comparison to the substrate 215. Consequently as the package 200 heats up due to operation the silicon die doesn't expand to any appreciable amount where as the substrate expands much more, and the mismatch between rates of expansion causes the shape of the package to warp.

The organic stiffener 220 mitigates these effects by creating an opposing, resisting, or counter-acting force, through the selection of appropriate materials which tend to bend the opposite direction or simply resist warping so as to impede the warping of the substrate 215 and therefore adding structure and rigidity to the package 200.

The organic stiffener 220 is interfaced with the heatpipe via non-adhesive contact 230 as depicted on the upper left of the copper pillar or alternatively may be interfaced via solder 225 as depicted on the upper right of the copper pillar. The organic stiffener 220 is interfaced to the substrate via solder 225 as depicted on the lower left of the copper pillar or alternatively may be interfaced via an electrically conductive adhesive 226 as is depicted on the lower right of the copper pillar.

The organic stiffener having the copper pillar 240 integrated therein provides a cost-effective shielding solution that not only minimizes EMI, but also mitigates package warpage to facilitate surface mount processes such as attaching the package to a motherboard through the ball grid array 235 and further mitigates the risk of CPU die 210 cracking during assembly or integration of the heatpipe 205 or other solution onto the package 200 and the CPU in particular.

A high power CPU die is capable of emanating electromagnetic radiation and harmonic frequencies, which may interfere with other devices operating within or near the package. EMI shielding provides a metallic cage surrounding a device, such as the CPU die, to protect other components from electromagnetic radiation and harmonic frequencies coming from the CPU during operation and also to protect the CPU from incoming electromagnetic radiation.

According to such embodiments, the organic stiffer with integrated EMI shielding is electrically interfaced to the top of the package 200 surface to provide an electrically-conductive path between the thermal solution, such as a heatsink or a heatpipe 205 as depicted here, and the organic stiffener or interposer 220. Electrically and thermally conductive material may be utilized in contact only 230 applications permitting subsequent heatpipe removal or electrically and thermally conductive material may be used to bond or adhere the organic stiffener to the heatpipe 205 using solder in permanently bonded applications. Any oxides on the top solder would be broken under the thermal enabling load.

In accordance with one embodiment a hole is drilled through the organic stiffener and the hole is then backfilled with copper or another metal to form the depicted copper pillar in the formation of the EMI metallic cage around the CPU die 210. A laser through-hole may be formed and filled with copper or another metal. A pre-made copper or metallic component may be integrated into the organic stiffener, for instance, formed within the organic stiffener during a molding process.

In such a way, a continuous electrical path is formed through the organic stiffener 220 via the copper pillar 240, regardless of how formed, and the copper pillar 240 is then soldered or electrically interfaced at both its top and bottom surfaces to the heatpipe and the substrate respectively.

By electrically interfacing the copper pillars 240 of the organic stiffener 220 to the metallic heatpipe 205 and the ground plane of the substrate 215, the CPU die 210 is completely enclosed within a metallic cage, thus electromagnetically shielding the CPU from both ingress and egress of interfering radiation.

In accordance with certain embodiments, electrically conductive adhesive or low-temperature solder (LTS) may be utilized to further improve EMI shielding by forming a permanent adhesive joint between the heatpipe and the organic stiffener 220.

The copper pillars 240 are further connected to the substrate 215 ground plane via the solder or electrically conductive adhesive on the bottom of the organic stiffener 220.

In accordance with a particular embodiment, the organic stiffener 220 is attached to the substrate 215 by dispensing solder paste and flux onto the substrate or package build up, placing the organic stiffener 220 onto the solder paste and flux dispensed upon the substrate 215, which is then followed by a high-temperature reflow to bond the organic stiffener 220 to the substrate 215.

Attaching the heatpipe to the surface of the package 200 may involve mechanically coupling or using fasteners such as screws, to attach the heatpipe to the surface of the package or to a motherboard upon which the package is installed so as to thermally interface the heatpipe to the CPU die.

Therefore, in accordance with certain embodiments, mitigation of die cracking risk is implemented through the use of a compliant thermal interface tape or film which flexibly yields to the heatpipe 205 during installation or alternatively through the removal of some of the heatpipe or heatsink material to remove stress concentrations in a known high risk area which makes the thin and fragile CPU die 210 especially prone to cracking.

Although a Ball Grid Array (BGA) is depicted, other embodiments may utilize a continuous solder package or multiple BGAs may be utilized, so long as a continuous electrical path is formed from the thermal solution at the top surface of the package down through the organic stiffener 220 via the copper or metallic pillars, into an electrical interface of the substrate such as the ground plane and then to the motherboard's ground via, for instance, the solder balls or BGA as depicted or other relevant electrical interface suitable to the design requirements of the computing device within which the package 200 is to be integrated.

FIG. 3A depicts a top view 300 of an organic stiffener or interposer having integrated therein an electromagnetic shield. In particular, upon the top surface 350 of the organic stiffener there can be seen both a cut-out or space for the CPU die 310 as well as a series of copper or metallic pillars 335 formed through the organic stiffener which thus permits the top and bottom surfaces of the organic stiffener to be electrically interfaced to the thermal solution at the top surface of the package and the substrate at the bottom portion of the package, thus creating a continuous electrical path and also forming the EMI cage completely surrounding the CPU die.

There is additionally depicted some separation between the copper pillars 335 forming the EMI cage within the organic stiffener. The separation or space between the copper pillars is frequency dependent. Both the pitch and quantity are also dependent upon the maximum frequency of operation including the harmonics, all of which may be modeled before hand so as to ensure appropriate EMI shielding. Lower frequencies permit fewer copper pillars 335 whereas higher frequencies require a greater quantity of copper pillars 335 which are spaced more closely together so as to shield or block the ingress or egress of electromagnetic radiation.

As depicted, the top view 300 of the organic stiffener forms a rectangular "picture frame" shaped component within which to surround the CPU die.

Figure 3B:
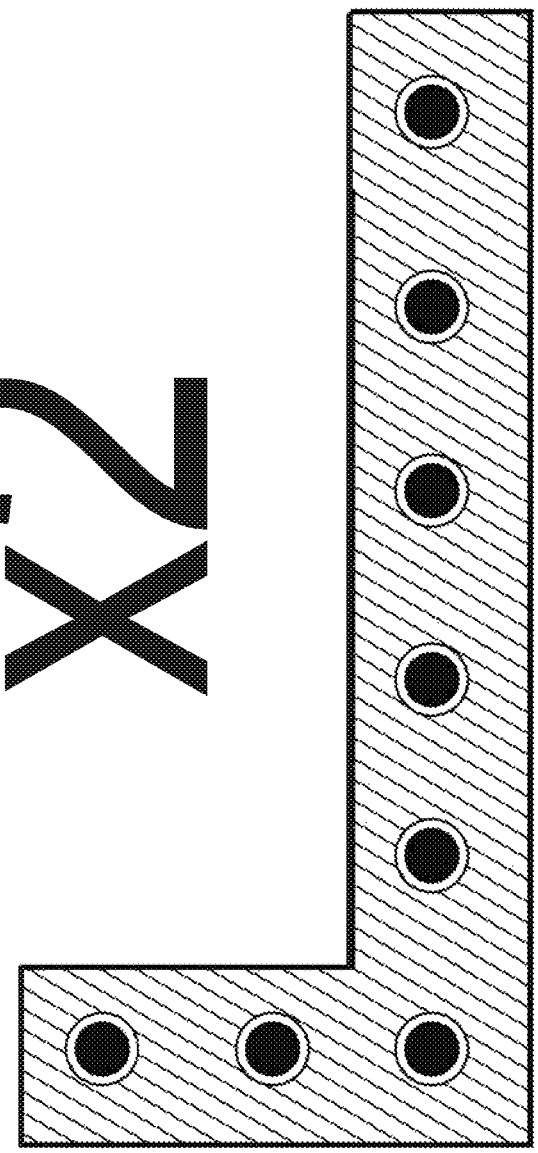
FIG. 3B depicts a top view of an alternative "L" shaped organic stiffener in accordance with described embodiments.

FIG. 3B depicts a top view 301 of an alternative "L" shaped organic stiffener or interposer in accordance with described embodiments. In particular, two such "L" shaped organic stiffeners may be utilized within a package to fully EMI shield a high powered functional semiconductor die consistent with the described embodiments. Use of two such "L" shaped components is functionally equivalent but may be advantageous for the purposes of manufacturing depending on the kind of semiconductor package and the buildup processes of the package.

Figure 3C:
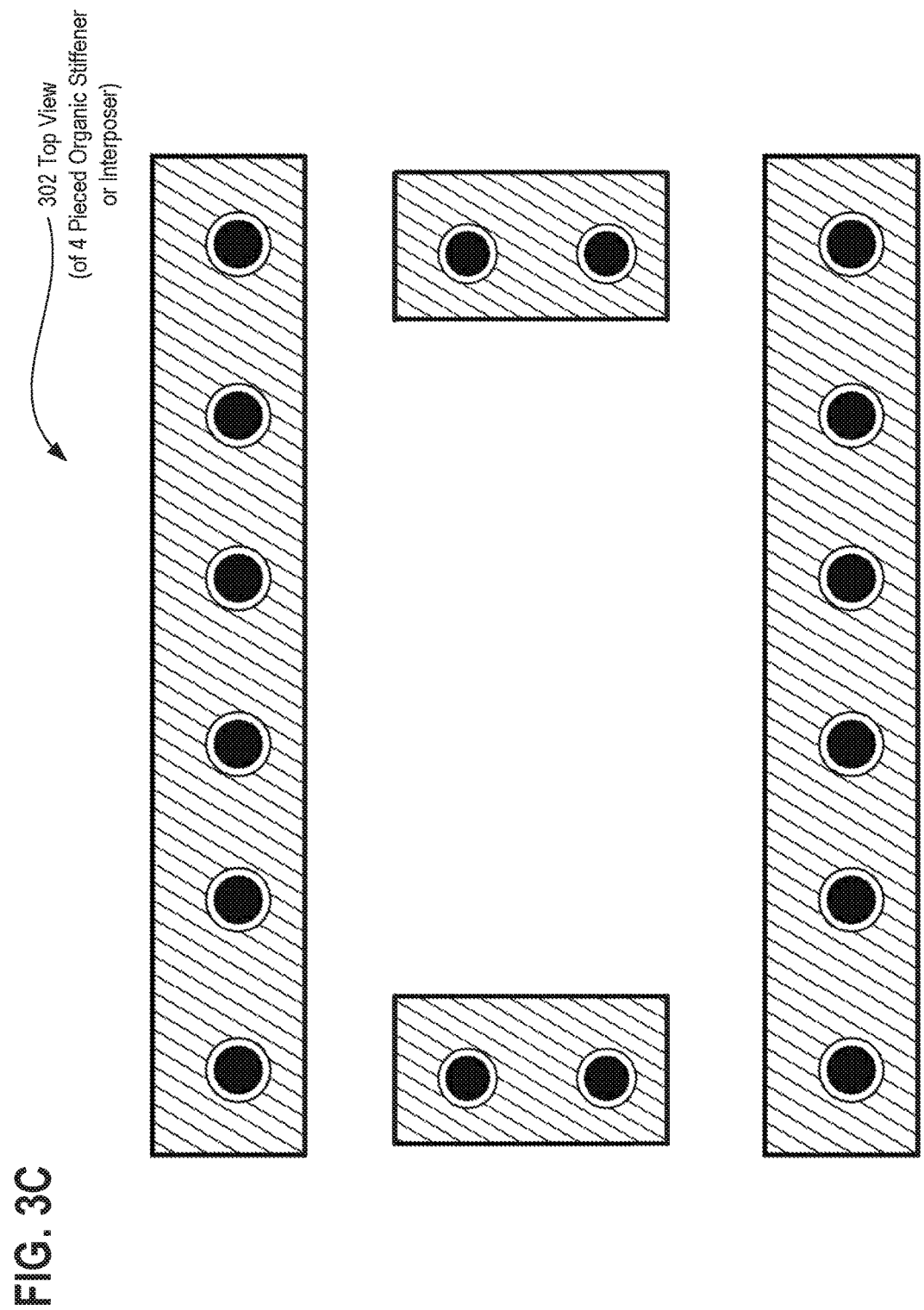
FIG. 3C depicts a top view of an alternative 4-pieced organic stiffener in accordance with described embodiments.

FIG. 3C depicts a top view of an alternative 4-pieced organic stiffener or interposer in accordance with described embodiments. In particular, four organic stiffeners may be utilized within a package to fully EMI shield a high powered functional semiconductor die consistent with the described embodiments. In yet another embodiment, two "C" or two "U" shaped organic stiffener pieces may be utilized as appropriate for the package design consistent with the described embodiments.

Figure 4:
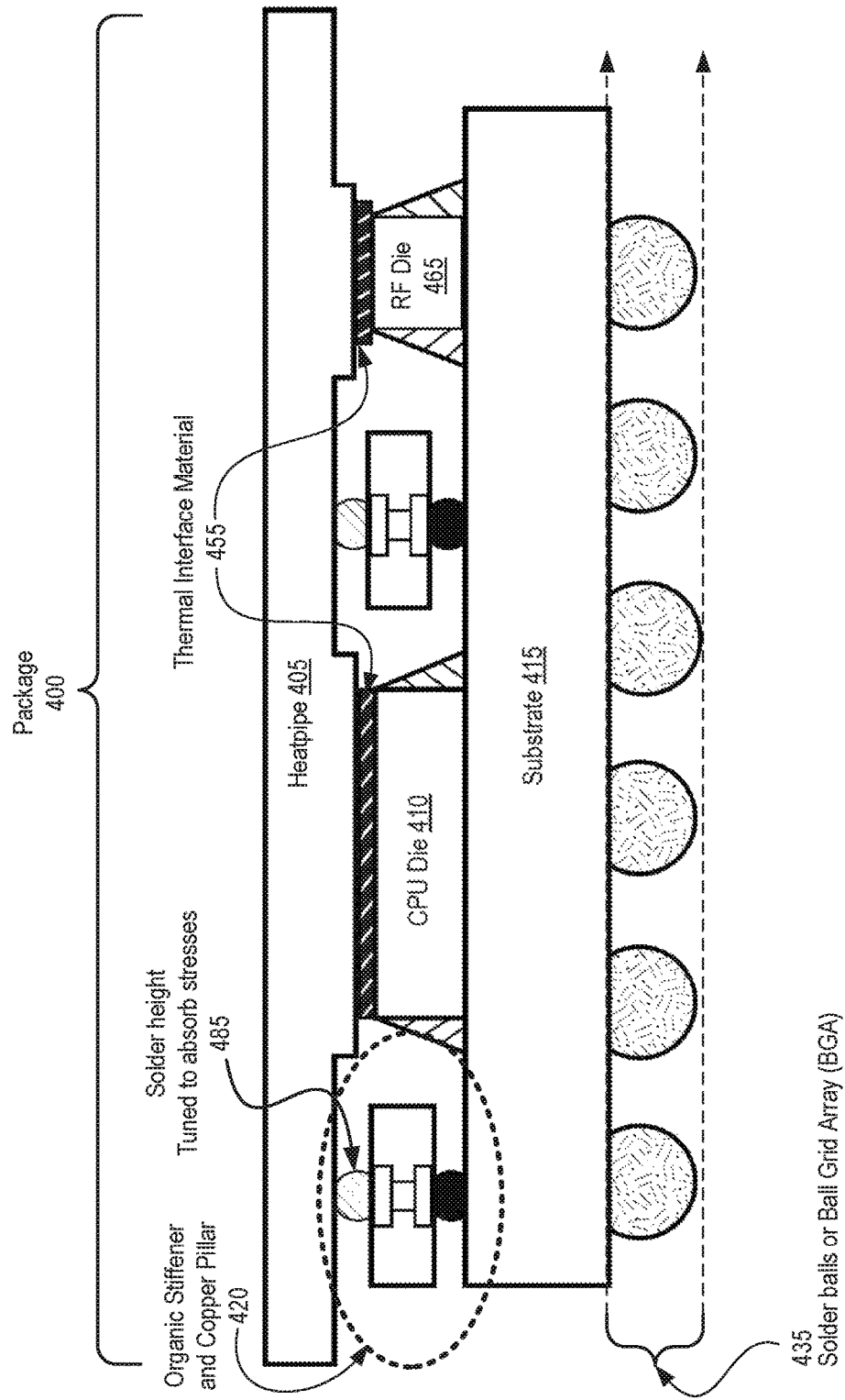
FIG. 4 depicts a package having embodied therein both a CPU die and an RF die on the same semiconductor package with EMI shielding surrounding the CPU die in accordance with described embodiments.

FIG. 4 depicts a package 400 having embodied therein both a CPU die 410 and an RF die 465 on the same semiconductor package with EMI shielding surrounding the CPU die 410 in accordance with described embodiments.

In particular, there are depicted solder balls or a ball grid array (BGA) 435 by which to electrically interface the substrate 415 of the package 400 to, for example, a mother board. The substrate 415 is electrically interfaced with both a CPU die 410 and also an RF die 465, both of which are present within relatively close proximity and also within the same semiconductor package 400. Such a design is not permissible using conventional solutions due to the problems discussed above, such as the electromagnetic interference of the CPU die 410 and the RF die 465 creating problematic interference with one an other. Thermal interface material 455 thermally interfaces each of the on-package dies to the heatpipe 405 or other thermal solution.

The RF die 465 is purposefully exposed and is not electromagnetically shielded from the outside of the package as it includes a transceiver and must transmit and receive signals wirelessly. However, within the depicted package 400, the RF die 465 and its antenna are electromagnetically shielded from the electromagnetic radiation and harmonic frequencies emanating from the CPU die 410. In a complementary fashion, the CPU die 410 is electromagnetically shielded from interference radiation from the RF die 465 and indeed, the CPU die 410 is fully enclosed and thus fully shielded by organic stiffener and its multiple copper pillars 420 fully surrounding the CPU die 410 creating a fully encompassing EMI cage for the CPU die 410 on all sides and also above and below through the continuous electrical path from the heatpipe 405 down through the copper pillars of the organic stiffener and into the ground plane of the substrate 405.

Because the CPU die 410 is fully enclosed by an EMI shield the RF die or another RF die package may be placed within very close proximity to the CPU die 410 or in close proximity to a CPU package installed on the motherboard without risking EMI interference to either component. Placing both CPU and RF dies on the same substrate within the same package puts the two components in extremely close proximity yet still permits each to operate without interference of EMI coupling between them.

In accordance with one embodiment an Output Distributional Influence Function (ODIF) wireless functional semiconductor die and a CPU die are integrated within the same package and upon the same substrate. Without the EMI shielding provided by the organic stiffener and its EMI shielding cage the CPU die 410, which is typically much more powerful than the RF die 465, may emanate powerful frequencies which degrade the performance of the RF die as they are picked up and amplified by the RF die 465. With the EMI shield as depicted here, the RF die 465 may operate free of stray emissions without needing to be isolated by distance from the CPU die 410 as is done with prior solutions.

Such close proximity may be especially beneficial in powerful but small computing devices such as smartphones and tablets as the small physical size of these devices introduces severe manufacturing constraints and effectively limits the distance from which two such devices may be physically separated. As depicted, such smartphones and tablets may be designed free of such a constraint as both the RF and CPU dies may be placed within close proximity, including within the same package, and still operate with optimal efficiency.

In accordance with the described embodiments, the interposers or copper pillars formed within the organic stiffener additionally provide improved thermal conductivity through the package to aid in the dissipation of heat generated by functional semiconductor dies, especially the high powered CPU which can generate immense temperatures within the package during operation. Because there is a continuous metallic interface from the substrate up through the copper bonds (e.g., the solder or electrically conductive adhesive) and into the copper pillar interposers of the organic stiffener and then into the heatpipe, there is also an improved thermal distribution structure within the package by which heat may more readily transfer to the top surface of the package for dissipating through the heatsink or heatpipe. Heat energy transfers more readily through copper pillar interposers than it will through air or even thermally conductive backfill or molding compound used for the package and as such, the rate of heat dissipation will increase, thus reducing the nominal operating temperature of the semiconductor package utilizing the described design.

In accordance with certain embodiments, cracking risk to the CPU die or other functional dies within the package is further mitigated by adjusting the height of the solder balls or the electrically interfacing material present between the bottom surface of the heatpipe and the top surface of the package before the heatpipe is installed. For instance, there is a risk that during installation of the heatpipe to the motherboard the pressure exhibited upon the CPU die at the top surface will be sufficient to crack the CPU die. By increasing the height of the solder balls at the top surface to receive the heatpipe the force of the heatpipe being installed may be better distributed as the heatpipe is attached (e.g., clasped, screwed, etc.) to the motherboard, thus helping to mitigate the risk of cracking the silicon die within the package.

According to certain embodiments, the height of the solder balls is tuned to absorb stresses 485 and provide the desired cushioning or force distributing effects.

Figure 5:
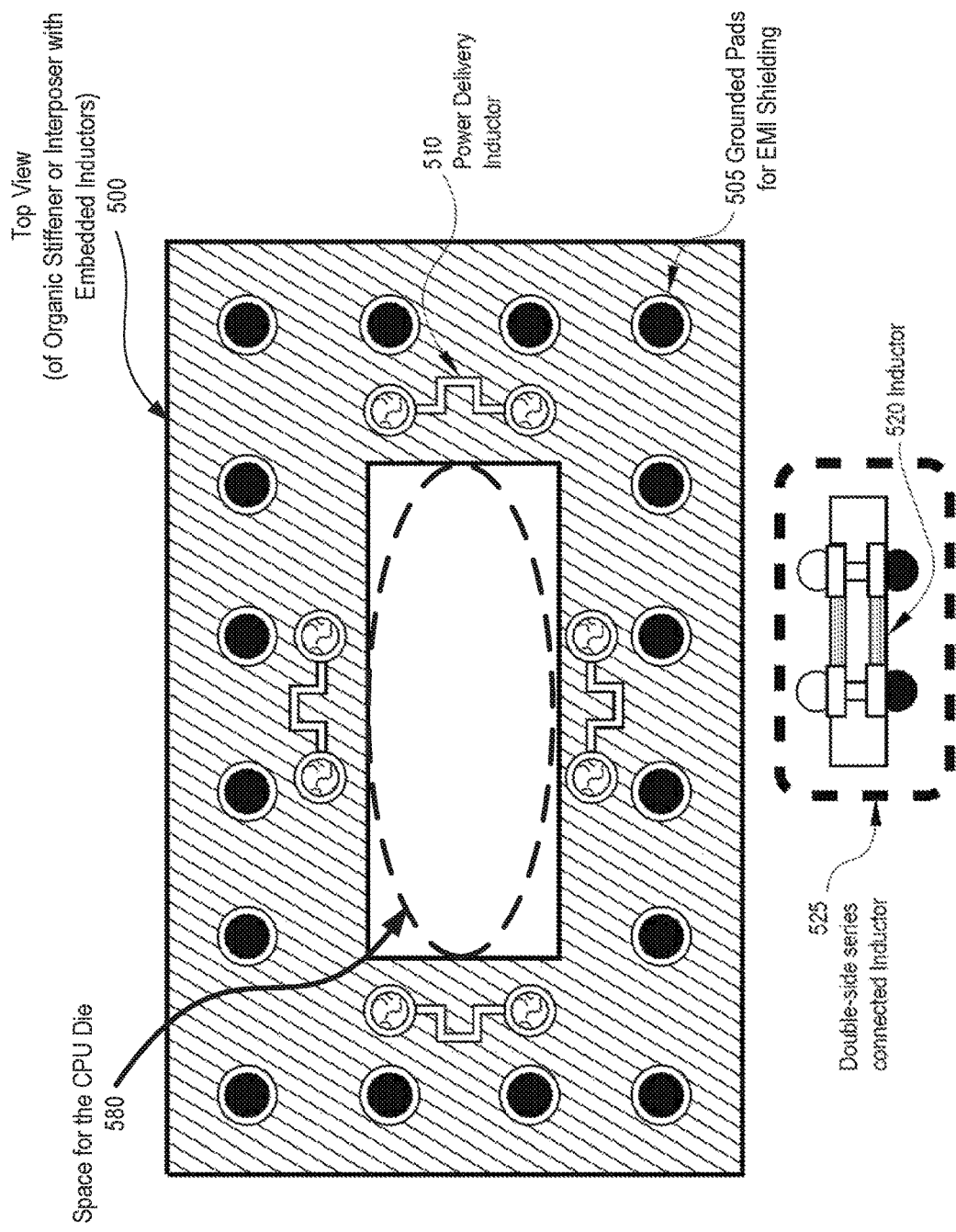
FIG. 5 depicts a semiconductor package having an organic stiffener with EMI shielding and embedded inductors for power delivery in accordance with described embodiments.

FIG. 5 depicts a semiconductor package having an organic stiffener with EMI shielding and embedded inductors for power delivery in accordance with described embodiments. In particular, there is depicted a top view 500 of an organic stiffener or interposer with embedded inductors as well as the copper pillars or other grounded pads for purposes of EMI shielding. Further depicted are the power delivery inductors 510 embedded within the organic stiffener. At the bottom there is depicted an alternative type inductor. Specifically, there is depicted a double side series connected inductor 525, having an inductor 520 both at the top and also at the bottom, as shown.

In accordance with a particular embodiment, passive conductors such as X/Y or Z-plane inductors or area capacitors are embodied within the form factor of the organic stiffener to provide power delivery or voltage regulation, as well as reduce form factor size of the main board, motherboard, package, or computing device.

Inductors are commonly utilized in computing devices and they take up valuable space. Therefore, in accordance with described embodiments, the inductors are integrated within the organic stiffener to save space and provide the same functionality.

In accordance with a particular embodiment the inductors are too large to fit the required quantity of inductors solely within the top layer and therefore both the top and bottom layers of the organic stiffer are utilized to accommodate one or more double sided inductors connected in series to provide the requisite power delivery for the package within a smaller form factor than would otherwise be feasible with separate surface mount inductors.

In accordance with a particular embodiment there are multiple metal layers formed within the substrate to provide an inductor with sufficient capacity.

By incorporating inductors into the organic stiffener the assembly process of the package may also be simplified as the inductors may be incorporated into the organic stiffener as a separate process.

Figure 6:
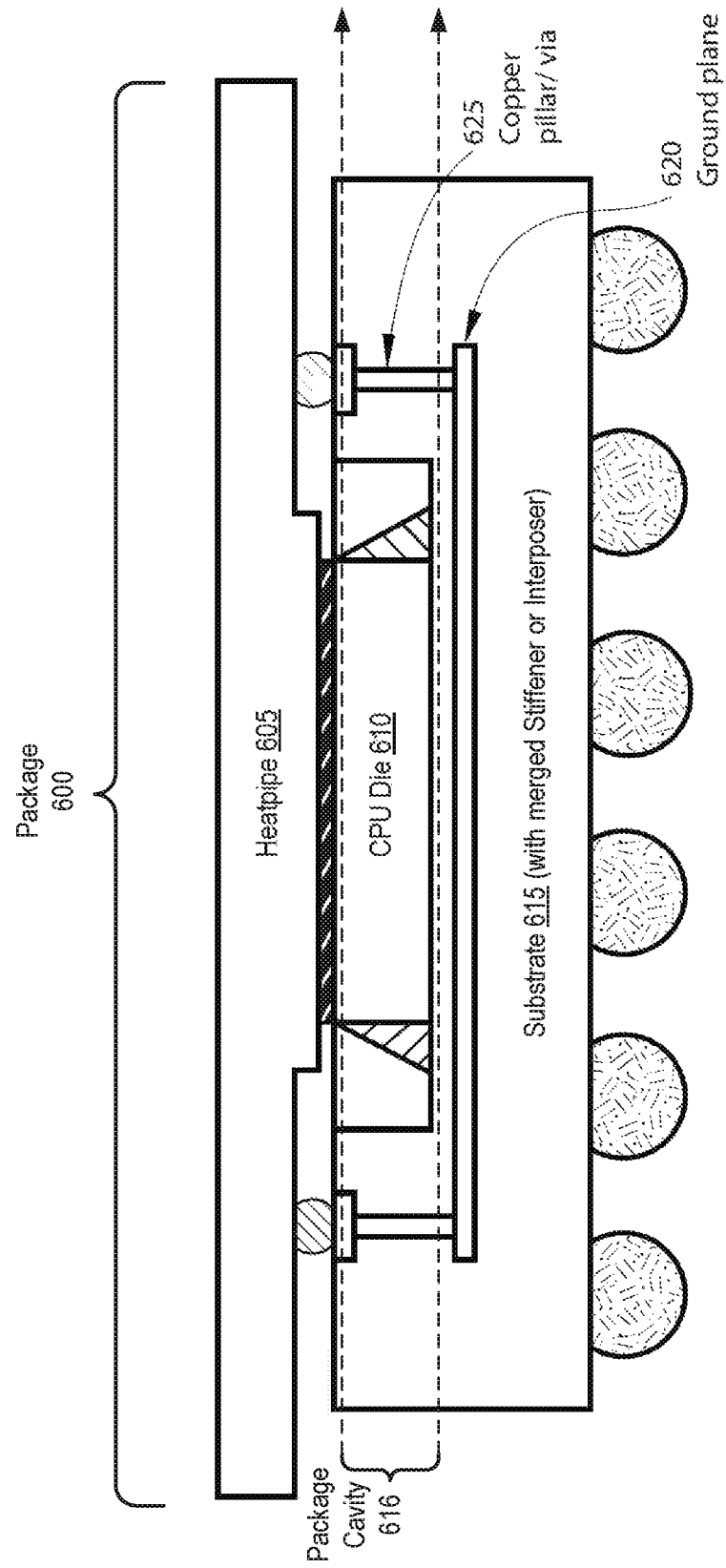
FIG. 6 depicts an alternative semiconductor package in accordance with described embodiments.

FIG. 6 depicts an alternative semiconductor package 600 in accordance with described embodiments. In particular, depicted package 600 having a substrate 615 with a merged stiffener or interposer in which a cavity 616 is formed within the substrate material. Within the cavity 616 an embedded die, such as the CPU die 610, is positioned such that the top surface of the CPU is approximately planer with the top surface of the package cavity 616 as depicted. The CPU may be back filled, underfilled, or molded so as to protect the CPU die 610 and as described previously the CPU is thermally interfaced to the heatpipe 605 via thermal interface material. Solder balls, which may be contact only or bonded, are positioned between the top of the copper pillars 625 or vias at the top surface of the substrate 615 having the cavity therein and the bottom surface of the heatpipe 605.

Additionally depicted here is the ground plane 620 of the substrate which in this embodiment forms a bottom most portion of the EMI cage in which the ground plane is electrically interface to the heatpipe 605 forming the topmost portion of the EMI cage by way of the depicted copper pillars 625 which thus form the surrounding sides of the EMI cage, so as to fully enclose the CPU die 610 within EMI shielding. Here the depicted substrate 615 is of a sufficient thickness that it forms the organic stiffener with the embedded EMI shielding via the top heatpipe, bottom ground plane, and surrounding copper pillars, whilst accommodating the physical space of the CPU die 610 within the formed cavity 616 of the package.

In accordance with such an embodiment, holes may be drilled or formed into the substrate 615 which are then filled with copper or other electrically conducting metals appropriate for EMI shielding.

Such a package design merges the organic stiffener into the substrate and may be appropriate for low voltage applications having, for example, very small semiconductor dies free of warpage concerns, and where a physically small size does not interfere with the functional requirements of the CPU die to be incorporated.

In accordance with a particular embodiment the CPU die 610 is electrically interfaced to the substrate and the edges of the substrate are built up or raised to fully surround the CPU die, thus forming the organic stiffener, within which the EMI shielding is attained through the heatpipe, ground plane, and copper pillars to enclose the CPU die within an EMI cage.

In accordance with such an embodiment the height of the edges of the substrate are raised to be equal in height to the CPU when positioned within the cavity of the package formed by the substrate.

In accordance with described embodiments the organic substrate is formed from a dielectric material including any of, for example, Ajinomoto build-up films (ABF) or thermoset resins and epoxy resins used for substrates and motherboards.

In accordance with one embodiment the CPU die is part of an electrically powered System On a Chip (SOC) logic device embedded within a formed cavity of the substrate of a semiconductor package.

Figure 7:
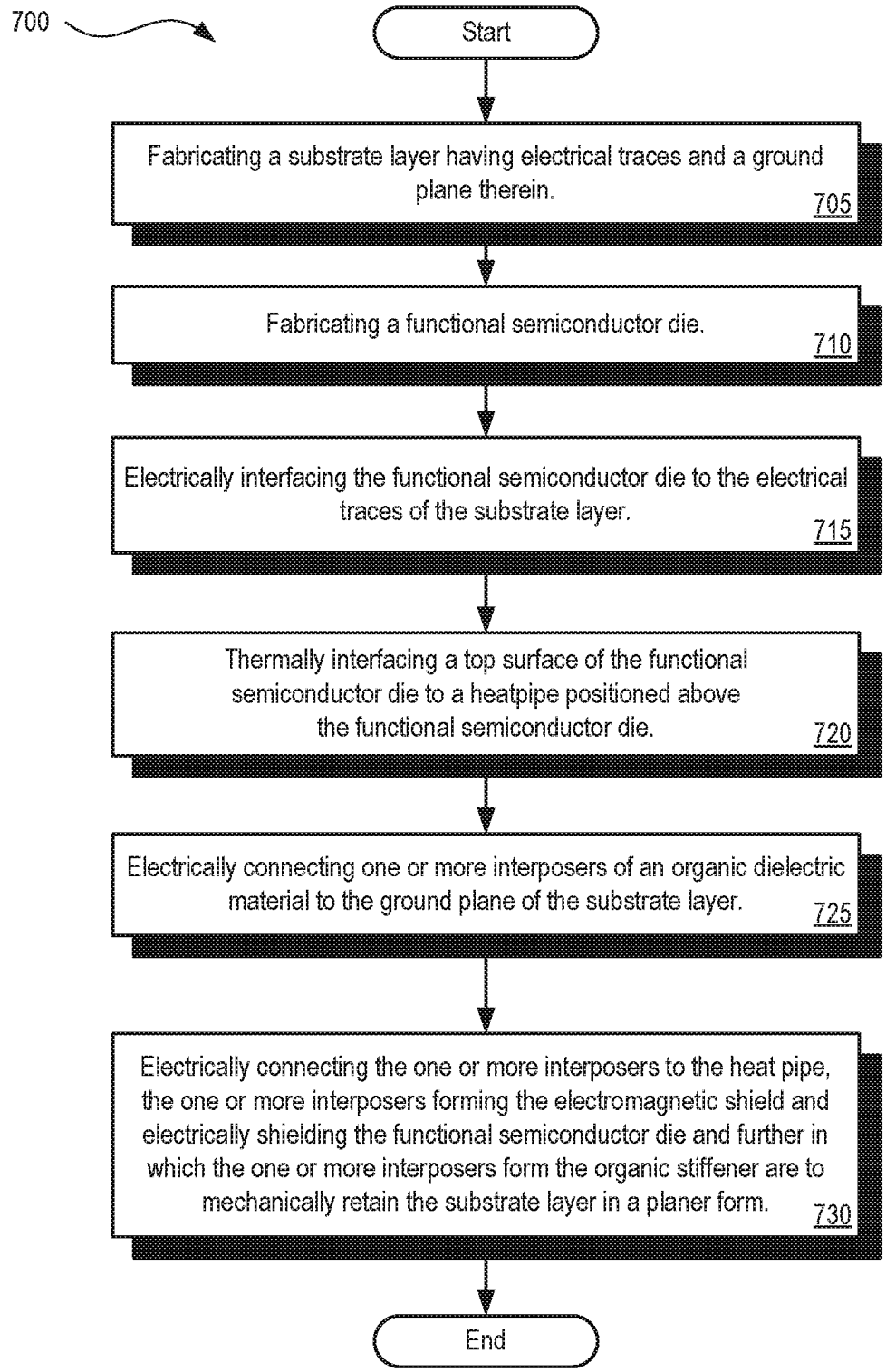
FIG. 7 is a flow diagram illustrating a method for implementing an organic stiffener with an EMI shield for RF integration in accordance with described embodiments.

FIG. 7 is a flow diagram illustrating a method 700 for implementing an organic stiffener with an EMI shield for RF integration in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 700 may be utilized in a variety of combinations.

At block 705 the method for implementing an organic stiffener with an EMI shield begins with fabricating a substrate layer having electrical traces and a ground plane therein.

At block 710 the method includes fabricating a functional semiconductor die.

At block 715 the method includes electrically interfacing the functional semiconductor die to the electrical traces of the substrate layer.

At block 720 the method includes thermally interfacing a top surface of the functional semiconductor die to a heatpipe positioned above the functional semiconductor die.

At block 725 the method includes electrically connecting one or more interposers of an organic dielectric material to the ground plane of the substrate layer.

At block 730 the method includes electrically connecting the one or more interposers to the heat pipe, the one or more interposers forming the electromagnetic shield and electrically shielding the functional semiconductor die and further in which the one or more interposers form the organic stiffener are to mechanically retain the substrate layer in a planer form.

Figure 8:
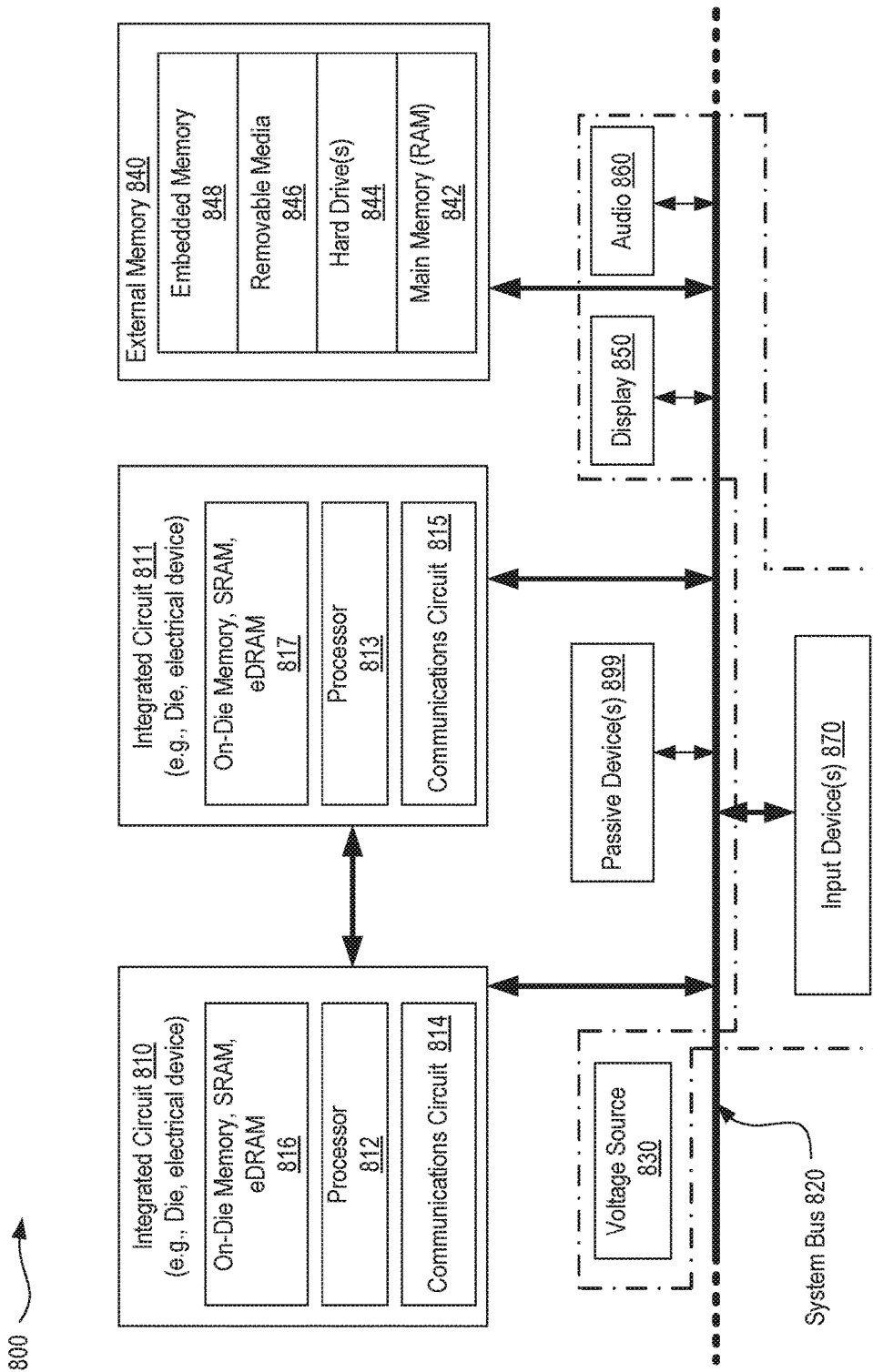
FIG. 8 is a schematic of a computer system in accordance with described embodiments.

FIG. 8 is a schematic of a computer system 800, in accordance with described embodiments. The computer system 800 (also referred to as the electronic system 800) as depicted can embody an organic stiffener with an EMI shield for RF integration, according to any of the several disclosed embodiments and their equivalents as set forth in this disclosure. The computer system 800 may be a mobile device such as a net-book computer. The computer system 800 may be a mobile device such as a wireless smart phone or tablet. The computer system 800 may be a desktop computer. The computer system 800 may be a hand-held reader. The computer system 800 may be a server system. The computer system 800 may be a supercomputer or high-performance computing system.

In accordance with one embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

Such an integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, electrical devices having an organic stiffener with an EMI shield for RF integration, as disclosed herein.

In accordance with one embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In accordance with one embodiment, the integrated circuit 810 is complemented with a subsequent integrated circuit 811. Useful embodiments include a dual processor 813 and a dual communications circuit 815 and dual on-die memory 817 such as SRAM. In accordance with one embodiment, the dual integrated circuit 810 includes embedded on-die memory 817 such as eDRAM.

In one embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In accordance with one embodiment, the electronic system 800 also includes a display device 850 and an audio output 860. In one embodiment, the electronic system 800 includes an input device 870 such as a controller that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including a package substrate having an organic stiffener with an EMI shield for RF integration, according to any of the several disclosed embodiments and their equivalents, an electronic system, a computer system, one or more methods of fabricating an integrated circuit, and one or more methods of fabricating an electronic assembly that includes a package substrate having an organic stiffener with an EMI shield for RF integration, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having an organic stiffener with an EMI shield for RF integration embodiments and their equivalents. A foundation substrate 898 may be included, as represented by the dashed line of FIG. 8. Passive devices 899 may also be included, as is also depicted in FIG. 8.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

It is therefore in accordance with the described embodiments, that:

According to one embodiment there is an apparatus to implement an organic stiffener with an electromagnetic shield, the apparatus comprising: a substrate layer having electrical traces and a ground plane therein; a functional semiconductor die electrically interfaced to the electrical traces of the substrate layer; a heatpipe thermally interfaced to a top surface of the functional semiconductor die; one or more interposers of an organic dielectric material electrically connected to the ground plane of the substrate layer and electrically connected to the heatpipe; wherein the one or more interposers form the electromagnetic shield to electrically shield the functional semiconductor die; and wherein the one or more interposers form the organic stiffener are to mechanically retain the substrate layer in a planer form.

According to one embodiment, the apparatus further comprises: a Radio Frequency (RF) semiconductor die electrically interfaced to the electrical traces of the substrate layer and thermally interfaced to the heatpipe; the RF semiconductor die having a wireless transceiver to transmit and receive signals wirelessly, wherein the RF semiconductor die is shielded from electromagnetic (EMI) radiation emanating from the functional semiconductor die by the electromagnetic shield which fully encompasses the functional semiconductor die within an EMI cage.

According to one embodiment, the functional semiconductor die comprises a Central Processing Unit (CPU) semiconductor die; and wherein the CPU semiconductor die is shielded from (EMI) radiation emanating from the RF semiconductor die by the EMI cage fully encompassing the CPU semiconductor die.

According to one embodiment, the apparatus embodies a semiconductor package having therein both the functional semiconductor die and the RF die internal to the semiconductor package; wherein the functional semiconductor die comprises a Central Processing Unit (CPU) circuit; wherein the semiconductor package is fully encased or at least partially underfilled with molding compound or encapsulation material at least partially encasing each of the CPU circuit and the RF die internal to the semiconductor package; and wherein the semiconductor package is to be installed upon a motherboard within a computing device subsequent to manufacture of the apparatus.

According to one embodiment, the apparatus embodies a semiconductor package having therein the functional semiconductor die internal to the semiconductor package, wherein the functional semiconductor die comprises a Central Processing Unit (CPU) functional semiconductor die; and wherein the one or more interposers form an organic stiffener layer between the substrate layer at a bottom portion of the semiconductor package and the heatpipe at a top portion of the semiconductor package.

According to one embodiment, the CPU functional semiconductor die and the one or more interposers are coplanar, in which the one or more interposers fully enclose the CPU functional semiconductor die on all sides.

According to one embodiment, apparatus embodies a semiconductor package for the functional silicon die; wherein the one or more interposers form an organic stiffener layer within the apparatus; and wherein the one or more interposers surround the functional semiconductor die which is positioned within an interior space of the organic stiffener layer formed from the one or more interposers.

According to one embodiment, the one or more interposers comprise one of: a single square or rectangular shape with a space in a center portion for the functional semiconductor die; a single picture frame shape with the space in the center portion for the functional semiconductor die; two "L" shaped interposers that form an organic stiffener layer within the apparatus with the space in the center portion for the functional semiconductor die; four straight interposers that form the organic stiffener layer within the apparatus with the space in the center portion for the functional semiconductor die; two "C" shaped interposers that form an organic stiffener layer within the apparatus with the space in the center portion for the functional semiconductor die; or two "U" shaped interposers that form an organic stiffener layer within the apparatus with the space in the center portion for the functional semiconductor die.

According to one embodiment, the one or more interposers each embody a plurality of copper pillars being electrically interfaced between the heatpipe and the substrate, the plurality of copper pillars of the one or more interposers forming the electromagnetic shield to electrically shield the functional semiconductor die.

According to one embodiment, a separation distance between each of the plurality of copper pillars of the one or more interposers is frequency calibrated to a maximum frequency of operation and harmonic frequencies which emanate from the functional semiconductor die during operation; and wherein the maximum frequency of operation and the harmonic frequencies are modeled prior to design of the separation distance between each of the plurality of copper pillars.

According to one embodiment, the apparatus embodies a three-dimensional (3D) semiconductor package having the functional semiconductor die buried internal to the 3D semiconductor package; wherein the functional semiconductor die comprises an electrically powered CPU die which generates heat within an interior core of the 3D semiconductor package; and wherein the 3D semiconductor package dissipates the heat from the CPU die from within the interior core of the 3D semiconductor package through thermal interface from the CPU die to the heatpipe and additionally through a plurality of copper pillars within the one or more interposers, the plurality of copper pillars forming the electromagnetic shield of the apparatus and additionally forming a continuous metallic interface between the substrate layer and the heatpipe through which heat may transfer to and dissipate from a top surface of the heatpipe of the apparatus.

According to one embodiment, one or more solder balls electrically interface the one or more interposers to the heatpipe on a one to one basis; and wherein a height of the solder balls is calibrated to provide cushion and stress distribution between the heatpipe and the functional semiconductor die to mitigate a cracking risk to the functional semiconductor die.

According to one embodiment, the heatpipe comprises an external thermal solution to be affixed to the apparatus subsequent to manufacture of the apparatus by a third party other than the manufacturer of the apparatus.

According to one embodiment, the apparatus embodies a semiconductor package or a three-dimensional (3D) substrate package or a stacked silicon die package; and wherein the functional semiconductor die is underfilled beneath the functional semiconductor die at least partially encasing the functional semiconductor die or alternatively wherein the apparatus is molded within an encapsulation material fully encasing at least the functional semiconductor die; and wherein the apparatus is molded or underfilled via any one of: underfill material; molding compound, encapsulation material; non-thermally conductive polymer; highly thermally conductive polymer having thermally conductive fillers embedded therein; or an epoxy flux.

According to one embodiment, the apparatus further comprises: one or more inductors embodied within the one or more interposers, the one or more inductors to provide power delivery to the functional semiconductor die.

According to one embodiment, each of the one or more inductors comprise a single sided inductor embedded within a first surface of the one or more interposers or alternatively wherein each of the one or more inductors comprise a double sided series connected inductor and embedded within both a first and a second surface of the one or more interposers.

According to one embodiment there is a semiconductor package to implement an organic stiffener with an electromagnetic shield, the semiconductor package comprising: a substrate layer having electrical traces and a ground plane therein; a CPU die electrically interfaced to the electrical traces of the substrate layer; a heatpipe thermally interfaced to a top surface of the CPU die; wherein sides of the substrate layer are built up to a height coplanar with a top surface of the CPU die forming a cavity within the substrate within which the CPU die is positioned; a plurality of copper pillars embodied within the sides of the substrate layer between the ground plane of the substrate layer and the heatpipe, each of the plurality of copper pillars being electrically interfaced to both the heatpipe and the ground plane of the substrate; wherein the plurality of copper pillars form the electromagnetic shield to electrically shield the CPU die; and wherein the sides of the substrate layer built up to a height coplanar with the top surface of the CPU die and having the plurality of copper pillars embodied therein form the organic stiffener are to mechanically retain the substrate layer in a planer form.

According to one embodiment, the organic stiffener is merged with the substrate layer forming the cavity of the substrate layer within which the CPU die is positioned.

According to one embodiment, a plurality of holes are drilled into the sides of the substrate layer and filled with copper to form the plurality of copper pillars embodied within the sides of the substrate layer; and wherein a separation distance between each of the plurality of holes within which the copper pillars are formed is frequency calibrated to a maximum frequency of operation and harmonic frequencies which emanate from the CPU die during operation.

According to one embodiment there is a method for implementing an organic stiffener with an electromagnetic shield, the method comprising: fabricating a substrate layer having electrical traces and a ground plane therein; fabricating a functional semiconductor die; electrically interfacing the functional semiconductor die to the electrical traces of the substrate layer; thermally interfacing a top surface of the functional semiconductor die to a heatpipe positioned above the functional semiconductor die; electrically connecting one or more interposers of an organic dielectric material to the ground plane of the substrate layer; electrically connecting the one or more interposers to the heat pipe; wherein the one or more interposers form the electromagnetic shield to electrically shield the functional semiconductor die; and wherein the one or more interposers form the organic stiffener are to mechanically retain the substrate layer in a planer form.

According to one embodiment the method further includes: electrically interfacing a Radio Frequency (RF) semiconductor die to the electrical traces of the substrate layer; wherein the RF semiconductor die includes a wireless transceiver to transmit and receive signals wirelessly; and wherein the RF semiconductor die is shielded from electromagnetic (EMI) radiation emanating from the functional semiconductor die by the electromagnetic shield which fully encompasses the functional semiconductor die within an EMI cage.

According to one embodiment, the functional semiconductor die comprises a Central Processing Unit (CPU) semiconductor die; and wherein the CPU semiconductor die is shielded from (EMI) radiation emanating from the RF semiconductor die by the EMI cage fully encompassing the CPU semiconductor die.

According to one embodiment there is a system to implement an organic stiffener with an electromagnetic shield, the system comprising: a processor and a memory to execute instructions; a printed circuit board (PCB) motherboard having the processor and the memory mounted thereupon; and a semiconductor package mounted to the PCB motherboard, the semiconductor package comprising: (i) a substrate layer having electrical traces and a ground plane therein, (ii) a functional semiconductor die electrically interfaced to the electrical traces of the substrate layer, (iii) a heatpipe thermally interfaced to a top surface of the functional semiconductor die, and (iv) one or more interposers of an organic dielectric material electrically connected to the ground plane of the substrate layer and electrically connected to the heatpipe, wherein the one or more interposers form the electromagnetic shield to electrically shield the functional semiconductor die and further wherein the one or more interposers form the organic stiffener are to mechanically retain the substrate layer in a planer form.

According to one embodiment, the system is embodied within one of: a smart phone; a tablet; a hand-held computing device; a personal computer; or a wearable technology to be worn as a clothing item or an accessory.

According to one embodiment, the semiconductor package of the system further comprises: (v) a Radio Frequency (RF) semiconductor die electrically interfaced to the electrical traces of the substrate layer and thermally interfaced to the heatpipe; wherein the RF semiconductor die includes a wireless transceiver to transmit and receive signals wirelessly; and wherein the RF semiconductor die is shielded from electromagnetic (EMI) radiation emanating from the functional semiconductor die by the electromagnetic shield which fully encompasses the functional semiconductor die within an EMI cage.

According to one embodiment, the functional semiconductor die comprises a Central Processing Unit (CPU) semiconductor die; and wherein the CPU semiconductor die is shielded from (EMI) radiation emanating from the RF semiconductor die by the EMI cage fully encompassing the CPU semiconductor die.

What is claimed is:

1. An apparatus to implement an organic stiffener with an electromagnetic shield, the apparatus comprising:
    a substrate layer having electrical traces and a ground plane therein;
    a functional semiconductor die electrically interfaced to the electrical traces of the substrate layer;
    a heatpipe thermally interfaced to a top surface of the functional semiconductor die; one or more interposers of an organic dielectric material electrically connected to the ground plane of the substrate layer and electrically connected to the heatpipe;
    wherein the one or more interposers form the electromagnetic shield to electrically shield the functional semiconductor die; and
    wherein the one or more interposers that form the organic stiffener are to mechanically retain the substrate layer in a planer form, wherein the one or more interposers each embody a plurality of solid conductive pillars being electrically interfaced between the heatpipe and the substrate.

2. The apparatus of claim 1, further comprising:
    a Radio Frequency (RF) semiconductor die electrically interfaced to the electrical traces of the substrate layer and thermally interfaced to the heatpipe;
    the RF semiconductor die having a wireless transceiver to transmit and receive signals wirelessly, wherein the RF semiconductor die is shielded from electromagnetic (EMI) radiation emanating from the functional semiconductor die by the electromagnetic shield which fully encompasses the functional semiconductor die within an EMI cage.

3. The apparatus of claim 2:
    wherein the functional semiconductor die comprises a Central Processing Unit (CPU) semiconductor die; and
    wherein the CPU semiconductor die is shielded from (EMI) radiation emanating from the RF semiconductor die by the EMI cage fully encompassing the CPU semiconductor die.

4. The apparatus of claim 2:
    wherein the apparatus embodies a semiconductor package having therein both the functional semiconductor die and the RF die internal to the semiconductor package;
    wherein the functional semiconductor die comprises a Central Processing Unit (CPU) circuit;
    wherein the semiconductor package is fully encased or at least partially underfilled with molding compound or encapsulation material at least partially encasing each of the CPU circuit and the RF die internal to the semiconductor package; and
    wherein the semiconductor package is to be installed upon a motherboard within a computing device subsequent to manufacture of the apparatus.

5. The apparatus of claim 1:
    wherein the apparatus embodies a semiconductor package having therein the functional semiconductor die internal to the semiconductor package, wherein the functional semiconductor die comprises a Central Processing Unit (CPU) functional semiconductor die; and
    wherein the one or more interposers form an organic stiffener layer between the substrate layer at a bottom portion of the semiconductor package and the heatpipe at a top portion of the semiconductor package.

6. The apparatus of claim 5, wherein the CPU functional semiconductor die and the one or more interposers are coplanar, in which the one or more interposers fully enclose the CPU functional semiconductor die on all sides.

7. The apparatus of claim 1:
    wherein the apparatus embodies a semiconductor package for the functional semiconductor die;
    wherein the one or more interposers form an organic stiffener layer within the apparatus; and
    wherein the one or more interposers surround the functional semiconductor die which is positioned within an interior space of the organic stiffener layer formed from the one or more interposers.

8. The apparatus of claim 1, wherein the one or more interposers comprise one of:
    a single square or rectangular shape with a space in a center portion for the functional semiconductor die;
    a single picture frame shape with the space in the center portion for the functional semiconductor die;
    two "L" shaped interposers that form an organic stiffener layer within the apparatus with the space in the center portion for the functional semiconductor die;
    four straight interposers that form the organic stiffener layer within the apparatus with the space in the center portion for the functional semiconductor die;
    two "C" shaped interposers that form an organic stiffener layer within the apparatus with the space in the center portion for the functional semiconductor die;
    or two "U" shaped interposers that form an organic stiffener layer within the apparatus with the space in the center portion for the functional semiconductor die.

9. The apparatus of claim 1, wherein the plurality of solid conductive pillars of the one or more interposers forming the electromagnetic shield to electrically shield the functional semiconductor die.

10. The apparatus of claim 9:
wherein a separation distance between each of the plurality of solid conductive pillars of the one or more interposers is frequency calibrated to a maximum frequency of operation and harmonic frequencies which emanate from the functional semiconductor die during operation; and
wherein the maximum frequency of operation and the harmonic frequencies are modeled prior to design of the separation distance between each of the plurality of solid conductive pillars.

11. The apparatus of claim 1:
wherein the apparatus embodies a three-dimensional (3D) semiconductor package having the functional semiconductor die buried internal to the 3D semiconductor package;
wherein the functional semiconductor die comprises an electrically powered CPU die which generates heat within an interior core of the 3D semiconductor package; and wherein the 3D semiconductor package dissipates the heat from the CPU die from within the interior core of the 3D semiconductor package through thermal interface from the CPU die to the heatpipe and additionally through a plurality of copper pillars within the one or more interposers, the plurality of copper pillars forming the electromagnetic shield of the apparatus and additionally forming a continuous metallic interface between the substrate layer and the heatpipe through which heat may transfer to and dissipate from a top surface of the heatpipe of the apparatus.

12. The apparatus of claim 1:
wherein one or more solder balls electrically interface the one or more interposers to the heatpipe on a one to one basis; and
wherein a height of the solder balls is calibrated to provide cushion and stress distribution between the heatpipe and the functional semiconductor die to mitigate a cracking risk to the functional semiconductor die.

13. The apparatus of claim 1:
wherein the apparatus embodies a semiconductor package or a three-dimensional (3D) substrate package or a stacked silicon die package; and
wherein the functional semiconductor die is underfilled beneath the functional semiconductor die at least partially encasing the functional semiconductor die or alternatively wherein the apparatus is molded within an encapsulation material fully encasing at least the functional semiconductor die; and
wherein the apparatus is molded or underfilled via any one of:
underfill material;
molding compound, encapsulation material;
non-thermally conductive polymer; highly thermally conductive polymer having thermally conductive fillers embedded therein; or an epoxy flux.

14. The apparatus of claim 1, further comprising:
one or more inductors embodied within the one or more interposers, the one or more inductors to provide power delivery to the functional semiconductor die.

15. The apparatus of claim 14, wherein each of the one or more inductors comprise a single sided inductor embedded within a first surface of the one or more interposers or alternatively wherein each of the one or more inductors comprise a double sided series connected inductor and embedded within both a first and a second surface of the one or more interposers.

16. A semiconductor package to implement an organic stiffener with an electromagnetic shield, the semiconductor package comprising:
a substrate layer having electrical traces and a ground plane therein;
a CPU die electrically interfaced to the electrical traces of the substrate layer;
a heatpipe thermally interfaced to a top surface of the CPU die;
wherein sides of the substrate layer are built up to a height coplanar with a top surface of the CPU die forming a cavity within the substrate within which the CPU die is positioned;
a plurality of copper pillars embodied within the sides of the substrate layer between the ground plane of the substrate layer and the heatpipe, each of the plurality of copper pillars being electrically interfaced to both the heatpipe and the ground plane of the substrate;
wherein the plurality of copper pillars form the electromagnetic shield to electrically shield the CPU die; and
wherein the sides of the substrate layer built up to a height coplanar with the top surface of the CPU die and having the plurality of copper pillars embodied therein form the organic stiffener are to mechanically retain the substrate layer in a planer form.

17. The semiconductor package of claim 16, wherein the organic stiffener is merged with the substrate layer forming the cavity of the substrate layer within which the CPU die is positioned.

18. The semiconductor package of claim 16:
wherein a plurality of holes are drilled into the sides of the substrate layer and filled with copper to form the plurality of copper pillars embodied within the sides of the substrate layer; and
wherein a separation distance between each of the plurality of holes within which the copper pillars are formed is frequency calibrated to a maximum frequency of operation and harmonic frequencies which emanate from the CPU die during operation.

19. A method for implementing an organic stiffener with an electromagnetic shield, the method comprising:
fabricating a substrate layer having electrical traces and a ground plane therein;
fabricating a functional semiconductor die;
electrically interfacing the functional semiconductor die to the electrical traces of the substrate layer;
thermally interfacing a top surface of the functional semiconductor die to a heatpipe positioned above the functional semiconductor die;
electrically connecting one or more interposers of an organic dielectric material to the ground plane of the substrate layer;
electrically connecting the one or more interposers to the heat pipe;
wherein the one or more interposers form the electromagnetic shield to electrically shield the functional semiconductor die; and wherein the one or more interposers form the organic stiffener are to mechanically retain the substrate layer in a planer form, and wherein the method further comprises:
electrically interfacing a Radio Frequency (RF) semiconductor die to the electrical traces of the substrate layer;
wherein the RF semiconductor die includes a wireless transceiver to transmit and receive signals wirelessly; and wherein the RF semiconductor die is shielded from electromagnetic (EMI) radiation emanating from the functional semiconductor die by the electromagnetic shield which fully encompasses the functional semiconductor die within an EMI cage.

20. The method of claim 19:
wherein the functional semiconductor die comprises a Central Processing Unit (CPU) semiconductor die; and
wherein the CPU semiconductor die is shielded from (EMI) radiation emanating from the RF semiconductor die by the EMI cage fully encompassing the CPU semiconductor die.

21. A system to implement an organic stiffener with an electromagnetic shield, the system comprising:
a processor and a memory to execute instructions;
a printed circuit board (PCB) motherboard having the processor and the memory mounted thereupon; and a semiconductor package mounted to the PCB motherboard, the semiconductor package comprising:
(i) a substrate layer having electrical traces and a ground plane therein,
(ii) a functional semiconductor die electrically interfaced to the electrical traces of the substrate layer,
(iii) a heatpipe thermally interfaced to a top surface of the functional semiconductor die,
(iv) one or more interposers of an organic dielectric material electrically connected to the ground plane of the substrate layer and electrically connected to the heatpipe, wherein the one or more interposers form the electromagnetic shield to electrically shield the functional semiconductor die and further wherein the one or more interposers form the organic stiffener are to mechanically retain the substrate layer in a planer form; and
(v) a Radio Frequency (RF) semiconductor die electrically interfaced to the electrical traces of the substrate layer and thermally interfaced to the heatpipe;
wherein the RF semiconductor die includes a wireless transceiver to transmit and receive signals wirelessly; and
wherein the RF semiconductor die is shielded from electromagnetic (EMI) radiation emanating from the functional semiconductor die by the electromagnetic shield which fully encompasses the functional semiconductor die within an EMI cage.

22. The system of claim 21, wherein the system is embodied within one of:
a smart phone;
a tablet;
a hand-held computing device;
a personal computer;
or a wearable technology to be worn as a clothing item or an accessory.

23. An apparatus to implement an organic stiffener with an electromagnetic shield, the apparatus comprising:
a substrate layer having electrical traces and a ground plane therein;
a functional semiconductor die electrically interfaced to the electrical traces of the substrate layer;
a heatpipe thermally interfaced to a top surface of the functional semiconductor die; one or more interposers of an organic dielectric material electrically connected to the ground plane of the substrate layer and electrically connected to the heatpipe, wherein the one or more interposers form the electromagnetic shield to electrically shield the functional semiconductor die,
wherein the one or more interposers form the organic stiffener are to mechanically retain the substrate layer in a planer form; and
a Radio Frequency (RF) semiconductor die electrically interfaced to the electrical traces of the substrate layer and thermally interfaced to the heatpipe;
the RF semiconductor die having a wireless transceiver to transmit and receive signals wirelessly, wherein the RF semiconductor die is shielded from electromagnetic (EMI) radiation emanating from the functional semiconductor die by the electromagnetic shield which fully encompasses the functional semiconductor die within an EMI cage.

24. The apparatus of claim 23:
wherein the functional semiconductor die comprises a Central Processing Unit (CPU) semiconductor die; and
wherein the CPU semiconductor die is shielded from (EMI) radiation emanating from the RF semiconductor die by the EMI cage fully encompassing the CPU semiconductor die.

25. The apparatus of claim 23:
wherein the apparatus embodies a semiconductor package having therein both the functional semiconductor die and the RF die internal to the semiconductor package;
wherein the functional semiconductor die comprises a Central Processing Unit (CPU) circuit;
wherein the semiconductor package is fully encased or at least partially underfilled with molding compound or encapsulation material at least partially encasing each of the CPU circuit and the RF die internal to the semiconductor package; and
wherein the semiconductor package is to be installed upon a motherboard within a computing device subsequent to manufacture of the apparatus.

26. An apparatus to implement an organic stiffener with an electromagnetic shield, the apparatus comprising:
a substrate layer having electrical traces and a ground plane therein;
a functional semiconductor die electrically interfaced to the electrical traces of the substrate layer;
a heatpipe thermally interfaced to a top surface of the functional semiconductor die; one or more interposers of an organic dielectric material electrically connected to the ground plane of the substrate layer and electrically connected to the heatpipe;
wherein the one or more interposers form the electromagnetic shield to electrically shield the functional semiconductor die; and
wherein the one or more interposers form the organic stiffener are to mechanically retain the substrate layer in a planer form, wherein the one or more interposers each embody a plurality of copper pillars being electrically interfaced between the heatpipe and the substrate, the plurality of copper pillars of the one or more interposers forming the electromagnetic shield to electrically shield the functional semiconductor die, and wherein a separation distance between each of the plurality of copper pillars of the one or more interposers is frequency calibrated to a maximum frequency of operation and harmonic frequencies which emanate from the functional semiconductor die during operation; and
wherein the maximum frequency of operation and the harmonic frequencies are modeled prior to design of the separation distance between each of the plurality of copper pillars.

27. An apparatus to implement an organic stiffener with an electromagnetic shield, the apparatus comprising:
a substrate layer having electrical traces and a ground plane therein;

a functional semiconductor die electrically interfaced to the electrical traces of the substrate layer;

a heatpipe thermally interfaced to a top surface of the functional semiconductor die; one or more interposers of an organic dielectric material electrically connected to the ground plane of the substrate layer and electrically connected to the heatpipe, wherein the one or more interposers form the electromagnetic shield to electrically shield the functional semiconductor die, and wherein the one or more interposers form the organic stiffener are to mechanically retain the substrate layer in a planer form; and one or more inductors embodied within the one or more interposers, the one or more inductors to provide power delivery to the functional semiconductor die.

28. The apparatus of claim 27, wherein each of the one or more inductors comprise a single sided inductor embedded within a first surface of the one or more interposers or alternatively wherein each of the one or more inductors comprise a double sided series connected inductor and embedded within both a first and a second surface of the one or more interposers.

\* \* \* \* \*